United States Patent [19]
Kamata et al.

[11] Patent Number: 6,110,987
[45] Date of Patent: Aug. 29, 2000

[54] PHOTOCURABLE COMPOSITION AND CURING PROCESS THEREFOR

[75] Inventors: Hirotoshi Kamata; Toshio Koshikawa; Takeo Watanabe; Kazuhiko Ooga; Shuichi Sugita, all of Chiba, Japan

[73] Assignee: Showa Denko K.K., Tokyo, Japan

[21] Appl. No.: 08/893,390

[22] Filed: Jul. 11, 1997

[30] Foreign Application Priority Data

Jul. 16, 1996 [JP] Japan ................................ 8-186307
Mar. 17, 1997 [JP] Japan ................................ 9-062628

[51] Int. Cl.$^7$ ........................................... C08F 21/46
[52] U.S. Cl. ................. 522/64; 522/14; 522/25; 522/18; 522/28; 522/38; 430/280.1; 430/288.1
[58] Field of Search ................ 430/280.1, 288.1; 522/28, 14, 18, 38, 64

[56] References Cited

U.S. PATENT DOCUMENTS

| | | | |
|---|---|---|---|
| 3,567,453 | 3/1971 | Borden | 96/91 |
| 4,307,182 | 12/1981 | Dalzell et al. | 430/339 |
| 4,450,227 | 5/1984 | Holmes et al. | 430/339 |
| 4,751,102 | 6/1988 | Adair et al. | 427/53.1 |
| 4,772,541 | 9/1988 | Gottschalk et al. | 430/339 |
| 4,937,161 | 6/1990 | Kita et al. | 430/281 |
| 5,055,372 | 10/1991 | Shanklin et al. | 430/138 |
| 5,124,236 | 6/1992 | Fukui et al. | 430/281 |
| 5,168,032 | 12/1992 | Okamoto et al. | 430/281 |
| 5,176,984 | 1/1993 | Hips, Sr. et al. | 430/281 |
| 5,200,438 | 4/1993 | Fuji et al. | . |
| 5,496,903 | 3/1996 | Watanabe et al. | 526/204 |
| 5,500,453 | 3/1996 | Toba et al. | 522/25 |

FOREIGN PATENT DOCUMENTS

| | | |
|---|---|---|
| 52-135341 | 11/1977 | Japan . |
| 52-152436 | 12/1977 | Japan . |
| 675374 | 3/1984 | Japan . |
| 1229084 | 9/1989 | Japan . |
| 222370 | 1/1990 | Japan . |
| 2296875 | 12/1990 | Japan . |
| 36265 | 1/1991 | Japan . |

*Primary Examiner*—James J. Seidleck
*Assistant Examiner*—Sanza L. McClendon
*Attorney, Agent, or Firm*—Sughrue, Mion, Zinn, Macpeak & Seas, PLLC

[57] ABSTRACT

A photocurable composition comprising an ultraviolet radical polymerization initiator, a cationic dye with absorptions in the visible light region, a quaternary boron salt and optionally a polymerization accelerator, is irradiated with ultraviolet light and visible light either simultaneously or separately, to achieve adequate hardening in air of both the surface and the interior of the cured product, and to provide a cured product with an excellent appearance and without production of coloring substances derived from the polymerization initiator.

10 Claims, No Drawings

PHOTOCURABLE COMPOSITION AND CURING PROCESS THEREFOR

BACKGROUND OF THE INVENTION

1. Field of the Invention

The present invention relates to a photocurable composition and a curing process therefor. In particular, the present invention relates to a photocurable composition which can be cured not only on the curing surface but also to the interior of the cured product with notably minimized coloration of the cured product resulting from the polymerization initiator, by irradiation with ultraviolet light in the range of 200–400 nm and visible light in the range of 400–740 nm, even when using materials which exhibit poor light transmittance as a result of containing pigments and coloring dyes with strong hiding powers or having large thicknesses, as well as to a process for curing the photocurable material.

2. Description of the Related Art

Photopolymerization has been conventionally employed for a wide range of multifaceted uses, including curing and printing of coatings, resin relief-printing, printed board construction, resist and photo masking, black-and-white and color transfer coloring sheets and coloring sheet preparation, etc., and the recent focus on environmental issues, energy conservation and labor-saving means to counter increasing labor costs has stimulated active development with an emphasis on polymerization at normal temperature, rapid curing and the ability to be used without a solvent, which are features of photopolymerization.

In the area of printing ink, research has been progressing an ultraviolet photocuring inks for the purpose of elimination of solvents, improving productivity through achieving more rapid curing, or provision of superior physical characteristics for cured coatings (For example, Japanese Unexamined Patent Publications No. 1-229084 and No. 2-22370). In Japanese Unexamined Patent Publication No. 2-22370 there is disclosed an ultraviolet photocuring ink with an excellent-curing rate and coating hardness, which is characterized by containing a poly(meth)acrylic acid ester and an ultraviolet photopolymerization initiator.

Also, while research in the area of coating paints continues with respect to rapid curing and curing of colored coatings (for example, Japanese Unexamined Patent Publications No. 52-135341, No. 52-152436, No. 2-296875 and No. 3-6265), curing with ultraviolet light results in rapid curing of polymerizable monomers when cationic polymerization or radical polymerization is performed with irradiation of ultraviolet light of 200–400 nm, and therefore penetration of ultraviolet light has been a problem with colored coatings containing pigments or dyes with strong hiding powers.

For example, when a pigment or a coloring dye with a strong hiding power is added to give a colored coating with the aforementioned superior hiding power, the light transmittance is impaired by absorption or reflection of light by the pigment or coloring dye, resulting in a problem in which the coating surface cures but the interior of the coating fails to sufficiently harden. Also, even in transparent compositions containing no pigments or coloring dyes, if the curing composition thickness is increased or the curing composition contains a material with poor ultraviolet transmittance, the same problem occurs in which the interior of the curing composition fails to sufficiently harden.

In order to overcome this problem, an attempt has been made in Japanese Unexamined Patent Publication No. 6-75374 to increase the interior curability of photocurable compositions containing pigments, by adding a near-infrared radical polymerization initiator comprising a near-infrared light absorbing cationic dye and an organic boron salt sensitizer to an ultraviolet radical polymerization initiator. However, this composition has had a disadvantage in that the ultraviolet decomposition product of the near-infrared light absorbing cationic dye has caused coloration of the material after photocuring.

SUMMARY OF THE INVENTION

It is an object of the present invention to provide a photocurable composition which can be adequately cured not only on the surface but also in the interior by simultaneous or separate irradiation of ultraviolet light of 200–400 nm and visible light of 400–740 nm, and which gives cured products having an excellent appearance without coloring caused by the polymerization initiator, even with curing compositions comprising coloring materials with strong hiding powers such as pigments and coloring dyes and including materials with poor ultraviolet light transmittance, which compositions have presented difficulties for conventional ultraviolet curing, as well as a photocuring process therefor.

In order to overcome these problems, the present inventors have conducted diligent research on photocurable compositions employing ultraviolet radical polymerization initiators with absorptions between 200–400 nm, cationic dyes with visible light absorptions between 400–740 nm and quaternary boron salts as sensitizers, and on photocuring processes, and as a result the inventors have completed the present invention upon the discovery of a photocurable composition and a photocuring process therefor, whereby adequate hardening can be achieved both on the surface and in the interior of the cured product even when the composition contains pigments or coloring dyes with strong hiding powers, and whereby a cured product with an excellent outer appearance can be achieved without the production of coloring substances derived from the polymerization initiator.

In other words, according to the invention it is possible to obtain a photocurable composition with which adequate photocuring can be achieved both on the surface and in the interior even when the composition contains additives with strong hiding powers, and which gives cured products with an excellent appearance without coloring derived from the polymerization initiator, prepared by combining an ultraviolet radical polymerization initiator with a cationic dye represented by general formula (1):

$$D^+ \cdot A_1^- \qquad (1)$$

wherein $D^+$ is a cationic dye with absorptions in the visible light regions of 400–740 nm and $A_1^-$ is an anion, and a quaternary boron salt sensitizer represented by general formula (2):

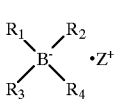

(2)

wherein $R_1$, $R_2$, $R_3$ and $R_4$ each independently represent an alkyl group which may have a substituent, an aryl group which may have a substituent, an allyl group which may have a substituent, an aralkyl group which may have a substituent, an alkenyl group which may have a substituent, an alkynyl group which may have a substituent, a silyl group which may have a substituent, a heterocyclic group or a halogen atom, and $Z^+$ represents a quaternary ammonium cation, quaternary pyridinium cation, quaternary quinolinium cation, phosphonium cation, sulfonium cation, oxosulfonium cation, iodonium cation or metal cation, and mixing these with a compound which has a radical polymerizable unsaturated group. Furthermore, according to the present invention it is possible to further improve the interior curability of the coating by adding to the above-mentioned photocurable composition one or more polymerization accelerators selected from compounds represented by general formulas (3) to (8).

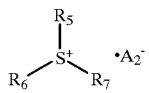  (3)

wherein $R_5$ and $R_6$ each represent an aryl group which may have a substituent, $R_7$ represents an alkyl group which may have a substituent, an alkenyl group which may have a substituent, an alkynyl group which may have a substituent, an alicyclic group which may have a substituent, an aryl group which may have a substituent or an aralkyl group which may have a substituent, and $A_2^-$ represents an anion.

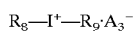  (4)

wherein $R_8$ and $R_9$ represents aryl groups which may have substituents, and $A_3^-$ represents an anion.

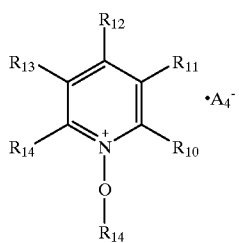  (5)

wherein $R_{10}$, $R_{11}$, $R_{12}$, $R_{13}$ and $R_{14}$ each represent a hydrogen atom, halogen atom, cyano group, an alkyl group which may have a substituent, an alkoxy group which may have a substituent, an aryl group which may have a substituent or a heterocyclic group represented by general formula (5), $R_{15}$ represents an alkyl group which may have a substituent, and $A_4^-$ represents an anion.

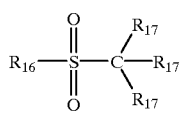  (6)

wherein $R_{16}$ represents an aryl group which may have a substituent, and each $R_{17}$ represents a halogen atom.

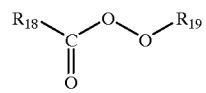  (7)

wherein $R_{18}$ represents an aryl group which may have a substituent, and $R_{19}$ represents an alkyl group which may have a substituent, an aryl group which may have a substituent or a benzoyl group which may have a substituent.

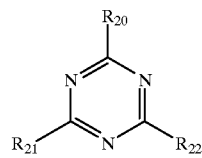  (8)

wherein $R_{20}$, $R_{21}$ and $R_{22}$ each represent a trihalomethyl group, an alkyl group which may have a substituent, an alkenyl group which may have a substituent or an aryl group which may have a substituent, provided that at least one thereof is a trihalomethyl group.

DESCRIPTION OF THE PREFERRED EMBODIMENTS

When the cationic dye of general formula (1) and the quaternary boron salt sensitizer of general formula (2) are used together according to the construction of the present invention, decomposition occurs with light of wavelength between 400 and 740 nm, and polymerization is initiated concurrently with loss of the color of the cationic dye. When no quaternary boron salt sensitizer is present, the decoloration reaction of the cationic dye fails to proceed sufficiently, thus impeding the polymerization reaction; however, the presence of the sensitizer according to the invention results in complete decoloration reaction of the cationic dye, and thus efficient progress of the polymerization initiation. Also, by the further addition of a polymerization accelerator represented general formulas (3) to (8), the polymerization initiation proceeds even more efficiently. These polymerization accelerators may be compounds which produce radicals by receiving electrons from the dye radical which are generated by irradiation of light of wavelength between 400 and 740 nm, and are thus able to notably improve the interior curability of the cured product.

In the cationic dye of general formula (1), which has absorptions between 400–740 nm, preferred cations ($D^+$) may include, for example, cationic portions of polymethine-, xanthene-, acridine-, azine-, oxazine-, thiazine-, diarylmethane- and triarylmethane cationic dyes, of which some concrete ones are listed in Table 1, but the present invention is not limited to these examples.

TABLE 1

| No. | Chemical structure | Maximum absorption wavelength (type of solvent) |
|---|---|---|
| 1 | | 428 nm (chloroform) |
| 2 | | 522 nm (acetonitrile) |
| 3 | | 528 nm (chloroform) |
| 4 | | 528 nm (ethanol) |
| 5 | | 544 nm (acetonitrile) |
| 6 | | 559 nm (acetonitrile) |

TABLE 1-continued
| No. | Chemical structure | Maximum absorption wavelength (type of solvent) |
|---|---|---|
| 7 | 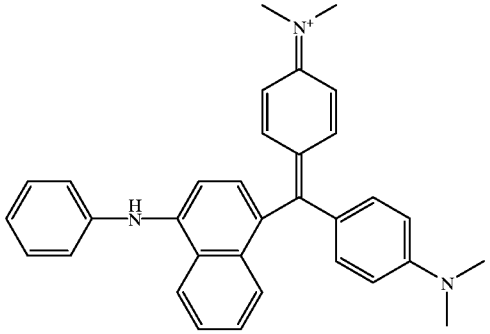 | 613 nm (acetonitrile) |
| 8 | 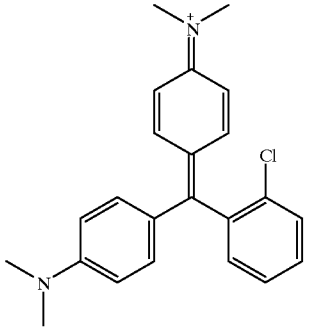 | 632 nm (acetonitrile) |
| 9 | 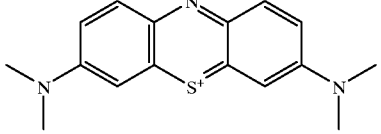 | 658 nm (chloroform) |
| 10 | 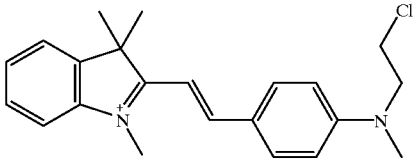 | 527 nm (acetonitrile) |
| 11 | 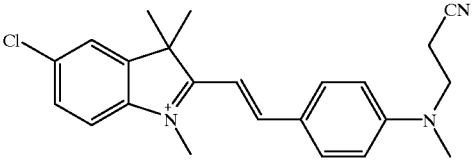 | 534 nm (acetonitrile) |
| 12 | 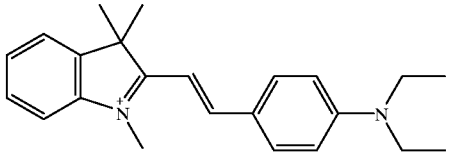 | 549 nm (acetonitrile) |

TABLE 1-continued

| No. | Chemical structure | Maximum absorption wavelength (type of solvent) |
|---|---|---|
| 13 | | 560 nm (acetonitrile) |
| 14 | | 589 nm (acetonitrile) |

Since these dyes have a short or no polymethine skeleton in the molecule, they are resistant to oxidation by oxygen in the air during ultraviolet irradiation, resulting in minimal production of cationic dye oxides which impair the color phase of the cured product, and are thus able to give cured products with excellent appearances.

The counter anion ($A_1^-$) of the cationic dye of general formula (1) may be any desired anion, and as examples there may be mentioned halide anions such as chloride, bromide and iodide anions; sulfonate anions such as benzenesulfonate anion, p-toluenesulfonate anion and methanesulfonate anion; borate anions such as tetraphenyl borate, tetraanisyl borate, n-butyltriphenyl borate, n-butyltri (4-t-butylphenyl)borate, tetrabenzyl borate and tetrafluoroborate; and other types of anions such as $ClO_4^-$, $PF_6^-$ and $SbF_6^-$. The present invention, however, is not limited to these examples. Two or more of these cationic dyes may also be used in any desired proportion as necessary.

The quaternary boron salt sensitizer of the invention is represented by general formula (2).

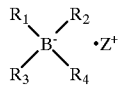

(2)

wherein $R_1$, $R_2$, $R_3$, $R_4$ and $Z^+$ are as defined above.

As concrete examples of the anion portion of the compounds with the structure represented by general formula (2) there may be mentioned n-butyltriphenyl borate, n-octyltriphenyl borate, n-dodecyltriphenyl borate, sec-butyltriphenyl borate, t-butyltriphenyl borate, benzyltriphenyl borate, n-butyltrianisyl borate, n-octyltrianisyl borate, n-dodecyltrianisyl borate, n-butyltri(4-tolyl)borate, n-butyltri(2-tolyl)borate, n-butyltri(4-t-butylphenyl)borate, n-butyltri(4-fluoro-2-methylphenyl)borate, n-butyltri(4-fluorophenyl)borate, n-butyltrinaphthyl borate, triphenylsilyltriphenyl borate, diphenylmethylsilyltriphenyl borate, dimethylphenylsilyltriphenyl borate, trimethylsilyltriphenyl borate, tetra-n-butyl borate, di-n-butyldiphenyl borate and tetrabenzyl borate.

As concrete examples of the cation portion there may be mentioned tetramethylammonium, tetraethylammonium, tetra-n-butylammonium, tetraoctylammonium, methylquinolinium, ethylquinolinium, methylpyridinium, ethylpyridinium, tetramethylphosphonium, tetra-n-butylphosphonium, trimethylsulfonium, triphenylsulfonium, trimethylsulfoxonium, diphenyliodonium, di(4-t-butylphenyl)iodonium, lithium cation and sodium cation. These anion portions and cation portions may be used for the invention in any desired combination. Also, the present invention is not limited to these examples. There is also no problem with using 2 or more quaternary boron salt sensitizers in combination.

Concrete examples of polymerization accelerators are given below. As the cation portion of the sulfonium salt represented by general formula (3) there may be mentioned triphenylsulfonium, diphenylanisylsulfonium, diphenyl(4-tolyl)sulfonium, diphenyl(4-fluorophenyl)sulfonium, diphenyl[4-(phenylthio)phenyl]sulfonium, diphenylbenzylsulfonium, diphenyl(4-chlorobenzyl) sulfonium, diphenyl(4-bromobenzyl)sulfonium, diphenyl(4-cyanobenzyl)sulfonium, di(4-t-butylphenyl) benzylsulfonium, dianisyl(4-bromobenzyl)sulfonium, diphenylphenacylsulfonium, diphenyl(4-chlorophenacyl) sulfonium, diphenyl(4-cyanophenacyl)sulfonium, diphenylallylsulfonium, diphenylmesylsulfonium, diphenyl-p-toluenesulfonylmethylsulfonium, diphenyl (dimethylsulfoniumylmethyl)sulfonium, and diphenyl[4-(diphenylsulfoniumyl)phenyl]sulfonium. As the anion portion there may be mentioned $BF_4^-$, $PF_6^-$, $AsF_6^-$, $SbF_6^-$, $ClO_4^-$, $Cl^-$, $Br^-$, tetraphenyl borate, tetrakis (pentafluorophenyl) borate, benzenesulfonate anion, p-toluenesulfonate anion and trifluoromethanesulfonate anion, and these anion portions and cation portions may be used for the invention in any desired combination.

As the cation portion of the iodonium salt represented by general formula (4) there may be mentioned diphenyliodonium, anisylphenyliodonium, di(4-t-butylphenyl)iodonium, di(4-chlorophenyl)iodonium, ditolyliodonium and di(3-nitrophenyl)iodonium, and as the anion portion there may be mentioned $BF_4^-$, $PF_6^-$, $AsF_6^-$, $SbF_6^-$, $ClO_4^-$, $Cl^-$, $Br^-$, tetraphenyl borate, tetrakis (pentafluorophenyl)borate, benzenesulfonate anion, p-toluenesulfonate anion and trifluoromethanesulfonate anion. These anion portions and cation portions may be used for the invention in any desired combination.

As the cation portion of the pyridinium salt represented by general formula (5) there may be mentioned N-methoxypyridinium, N-ethoxypyridinium, N-methoxy-2-picolinium, N-methoxy-3-picolinium, N-ethoxy-2-picolinium, N-ethoxy-3-picolinium, N-methoxy-4-bromopyridinium, N-methoxy-3-bromopyridinium, N-methoxy-2-bromopyridinium, N-ethoxy-4-bromopyridinium, N-ethoxy-3-bromopyridinium, N-ethoxy-2-bromopyridinium, N-ethoxy-4-chloropyridinium, N-ethoxy-3-chloropyridinium, N-ethoxy-2-chloropyridinium, N-methoxy-4-methoxypyridinium, N-methoxy-3-methoxypyridinium, N-methoxy-2-methoxypyridinium, N-ethoxy-4-methoxypyridinium, N-ethoxy-3-methoxypyridinium, N-ethoxy-2-methoxypyridinium, N-methoxy-4-phenylpyridinium, N-methoxy-3-phenylpyridinium, N-methoxy-2-phenylpyridinium, N-ethoxy-4-phenylpyridinium, N-ethoxy-3-phenylpyridinium, N-ethoxy-2-phenylpyridinium, N-methoxy-4-cyanopyridinium, N-ethoxy-4-cyanopyridinium, N,N'-dimethoxy-4,4'-bipyridinium, N,N'-diethoxy-4,4'-bipyridinium, N,N'-dimethoxy-2,2'-bipyridinium and N,N'-diethoxy-2,2'-bipyridinium. As the anion portion there may be mentioned $BF_4^-$, $PF_6^-$, $AsF_6^-$, $SbF_6^-$, $Cl^-$, $Br^-$, tetraphenyl borate, tetrakis(pentafluorophenyl) borate, benzenesulfonate anion, p-toluenesulfonate anion and trifluoromethanesulfonate anion. These anion portions and cation portions may be used for the invention in any desired combination.

As concrete examples of the halogenated sulfone compound represented by general formula (6) there may be mentioned trichloromethylphenylsulfone, tribromomethylphenylsulfone, trichloromethyl-4-chlorophenylsulfone, tribromomethyl-4-nitrophenylsulfone, 2-trichloromethylbenzothiazolesulfone, 2,4-dichlorophenyltrichloromethylsulfone, 2-methyl-4-chlorophenyltrichloromethylsulfone and 2,4-dichlorophenyltribromomethylsulfone.

As concrete examples of peroxides represented by general formula (7) there may be mentioned benzoyl peroxide, 2,4-dichlorobenzoyl peroxide, t-butylperoxybenzoate, di(t-butylperoxy)isophthalate, di(t-butylperoxy)terephthalate, di(t-butylperoxy)phthalate, 2,5-dimethyl-2,5-di(benzoylperoxy)hexane and 3,3',4,4'-tetra(t-butylperoxycarbonyl)benzophenone.

As concrete examples of triazine compounds represented by general formula (8) there may be mentioned 2,4,6-tris(trichloromethyl)-s-triazine, 2,4,6-tris(tribromomethyl)-s-triazine, 2,4-bis(dichloromethyl)-6-trichloromethyl-s-triazine, 2-propionyl-4,6-bis(trichloromethyl)-s-triazine, 2-benzoyl-4,6-bis(trichloromethyl)-s-triazine, 2-(4-cyanophenyl)-4,6-bis(trichloromethyl)-s-triazine, 2-(4-nitrophenyl)-4,6-bis(trichloromethyl)-s-triazine, 2-(4-chlorophenyl)-4,6-bis(trichloromethyl)-s-triazine, 2-(4-cumenyl)-4,6-bis(trichloromethyl)-s-triazine, 2-(4-aminophenyl)-4,6-bis(trichloromethyl)-s-triazine, 2,4-bis(4-methoxyphenyl)-6-trichloromethyl-s-triazine, 2,4-bis(3-chlorophenyl)-6-trichloromethyl-s-triazine, 2-(4-methoxystyryl)-4,6-bis(trichloromethyl)-s-triazine, 2-(4-chlorostyryl)-4,6-bis(trichloromethyl)-s-triazine, 2-(4-aminophenyl)-4,6-bis(trichloromethyl)-s-triazine, 2,4-bis(4-methoxyphenyl)-6-trichloromethyl-s-triazine, 2,4-bis(3-chlorophenyl)-6-trichloromethyl-s-triazine, 2-(4-methoxystyryl)-4,6-bis(trichloromethyl)-s-triazine, 2-(4-chlorostyryl)-4,6-bis(trichloromethyl)-s-triazine, 2-(4-aminostyryl)-4,6-bis(dichloromethyl)-s-triazine, 2-(4'-methoxy-1'-naphthyl)-4,6-bis(trichloromethyl)-s-triazine and 2-(6'-nitro-1'-naphthyl)-4,6-bis(trichloromethyl)-s-triazine. The above-mentioned polymerization accelerators of general formulas (3) to (8) may be used alone, but there is absolutely no problem with adding 2 or more.

The ultraviolet radical polymerization initiator used for the invention is a common photopolymerization initiator of the type which generates free radicals when excited by irradiation of ultraviolet light. Compounds with the structure represented by general formula (9) may be mentioned as examples thereof.

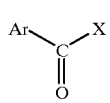

(9)

wherein Ar represents an aryl group which may have a substituent, and X represents an alkyl group, hydroxy-substituted alkyl group, halogen-substituted alkyl group, alkoxy-substituted alkyl group, morpholino-substituted alkyl group, amino-substituted alkyl group, benzyl group, hydroxy-substituted benzyl group, alkoxy-substituted benzyl group, alkoxycarbonyl group, an aryl group which may have a substituent or a phosphinoyl group with a substituent.

As concrete examples of compounds represented by the structure of general formula (9) there may be mentioned benzoin compounds such as benzoin alkyl ethers, e.g., benzoin isobutyl ether, benzoin isopropyl ether and benzoin ethyl ether, and benzyl dimethyl ketal; acetophenone compounds such as α-hydroxyalkylphenone compounds, α,α-dialkoxyalkylphenone compounds and α-aminoalkylphenone compounds, e.g., diethoxyacetophenone, 2-hydroxy-2-methyl-1-phenylpropan-1-one, 1-(4-isopropylphenyl)-2-hydroxy-2-methylpropan-1-one, 1-hydroxycyclohexyl phenyl ketone, 4-t-butyltrichloroacetophenone and 2-methyl-1-[4-(methylthio)phenyl]-2-morpholinopropanone-1,2-benzyl-2-dimethylamino-1-(4-morpholinophenyl)-butanone-1; glyoxy ester compounds such as methylphenyl glyoxylate; acylphosphine oxide compounds such as 2,4,6-trimethylbenzoyldiphenylphosphine oxide and bis(2,6-dimethoxybenzoyl)-2,4,4-trimethylpentylphosphine oxide; and benzophenone compounds such as benzophenone, benzoylbenzoic acid, methyl benzoylbenzoate, hydroxybenzophenone, 4-phenylbenzophenone and acrylate benzophenone.

Generally, compounds known as P1-type photoinitiators, such as benzoin compounds, acetophenone compounds, glyoxy ester compounds and acylphosphine oxide compounds, may also be used alone, but ultraviolet radical polymerization initiators such as benzophenone compounds which are so called P2-type photoinitiators are used together with a hydrogen donating compound.

A hydrogen donating compound is one which can donate hydrogen to the initiator which has been excited by light, and as examples thereof there may be mentioned aliphatic amines such as triethanolamine and methyldiethanolamine, and aromatic amines such as 2-dimethylaminoethylbenzoic acid, ethyl 4-dimethylaminobenzoate, isobutyl 4-dimethylaminobenzoate and 4,4-dimethylaminobenzophenone. These ultraviolet radical polymerization initiators may be used alone or in combinations of 2 or more.

The compound with an ethylenically unsaturated bond to be used for the invention may be any one which is a compound having at least one radical polymerizable ethylenically unsaturated bond in the molecule, and which has the chemical form of a monomer, oligomer or polymer. One of these may be used alone, or 2 or more may be combined in any desired proportion for improvement in the intended characteristics. The following may be mentioned as examples of such compounds with radical polymerizable ethylenically unsaturated bonds.

As polymerizable monomers there may be mentioned ester compounds of (meth)acrylic acid and monohydric alcohols, such as for example, methyl (meth)acrylate, ethyl (meth)acrylate, n-butyl (meth)acrylate, isobutyl (meth) acrylate, t-butyl (meth)acrylate, propyl (meth)acrylate, hexyl (meth)acrylate, octyl (meth)acrylate, lauryl (meth) acrylate, 2-ethylhexyl (meth)acrylate, cyclohexyl (meth) acrylate, stearyl (meth)acrylate, isobornyl (meth)acrylate, dicyclopentanyl (meth)acrylate, dicyclopentenyl (meth) acrylate, benzyl (meth)acrylate, butoxyethyl (meth)acrylate and phenoxyethyl (meth)acrylate.

Other monomers which may be used include vinylbenzenes such as styrene, vinylstyrene, methylstyrene, chlorostyrene and divinylstyrene; vinyl ethers such as isobutyl vinyl ether, methyl vinyl ether and 2-ethylhexyl vinyl ether; (meth)acrylic compounds such as (meth)acrylonitrile, (meth)acrylamide and methylene bis(meth)acrylamide; vinyl esters such as vinyl acetate, vinyl propionate and vinyl benzoate; and allyl group-containing monomers such as allyl alcohol, allyl acetate, diallyl phthalates and triallyl trimellitate, as well as other vinyl compounds.

Other monomers which may be used include carboxyl group-containing monomers such as (meth)acrylic acid; hydroxyl group-containing monomers such as 2-hydroxyethyl (meth)acrylate and 2-hydroxypropyl (meth) acrylate; addition products of isocyanate compounds such as butyl isocyanate and phenyl isocyanate with the aforementioned hydroxyl-containing monomers; and nitrogen-containing unsaturated monomers such as N-vinylpyrrolidone, N-vinylcarbazole, N-vinylacetamide and vinylpyridine.

Other monomers which may be used include polyfunctional vinyl compounds such as diethyleneglycol di(meth) acrylate, triethyleneglycol di(meth)acrylate, polyethyleneglycol di(meth)acrylate, propyleneglycol di(meth)acrylate, 1,3-butanediol di(meth)acrylate, 1,4-butanediol di(meth) acrylate, neopentylglycol di(meth)acrylate, 1,6-hexanediol di(meth)acrylate, trimethylolpropane tri(meth)acrylate, pentaerythritol tri(meth)acrylate, pentaerythritol tetra(meth) acrylate and dipentaerythritol hexa(meth)acrylate; products of reacting (meth)acrylic acid with addition products of polyhydric alcohols and ethylene oxide or propylene oxide; products of reacting (meth)acrylic acid with addition products of polyhydric alcohols and ε-caprolactone; phosphorus-containing polymerizable monomers, (meth)acrylic polyfunctional polyorganosilsesquioxanes, etc.

Polymerizable oligomers include ethylenically unsaturated bond-containing resins, among which there may be mentioned the following as concrete examples. (Meth) acryloyl group-containing polyester resins, unsaturated polyester resins, (meth)acryloyl group-containing polyurethane resins, (meth)acryloyl group-containing epoxy resins, (meth)acryloyl group-containing phosphorous epoxy resins, (meth)acryloyl group-containing acrylic resins, (meth) acryloyl group-containing polybutadiene resins and (meth) acryloyl group-containing silicone resins.

The cationic dye represented by general formula (1) may be used in an amount of 0.001–5 parts by weight to 100 parts by weight of the compound with an ethylenically unsaturated bond, to achieve the object of the present invention. At less than 0.001 part by weight the polymerization fails to proceed sufficiently, which can result in inadequate curing. At greater than 5 parts by weight the characteristics of the cured product are impaired while the cured product also undergoes coloration, making it impossible to achieve the object of the invention. The amount is preferred to be 0.01–2 parts by weight.

The quaternary boron salt sensitizer represented by general formula (2) may be used in an amount of 0.005–10 parts by weight to 100 parts by weight of the compound with an ethylenically unsaturated bond, to achieve the object of the present invention. At less than 0.005 part by weight the polymerization fails to proceed sufficiently, which can result in inadequate curing while also causing coloration of the cured product as the decoloration reaction of the cationic dye fails to proceed to a sufficient degree. At greater than 10 parts by weight, the characteristics of the cured product are impaired. The amount is preferred to be 0.05–5 parts by weight.

The polymerization accelerators represented by general formulas (3) to (8) may be used in an amount of 0.005–10 parts by weight to 100 parts by weight of the compound with an ethylenically unsaturated bond, to achieve the object of the present invention. At less than 0.005 part by weight the effect of the polymerization accelerator is not apparent. At greater than 10 parts by weight, the characteristics of the cured product are impaired, and the stability of the photocurable composition is notably reduced. The amount is preferred to be 0.01–5 parts by weight.

The ultraviolet radical polymerization initiator may be used in an amount of 0.01–10 parts by weight to 100 parts by weight of the compound with an ethylenically unsaturated bond, to achieve the object of the invention. At less than 0.01 part by weight the curing becomes impossible in air, and at greater than 10 parts by weight there are disadvantages of impaired characteristics of the cured product, as well as deterioration and yellowing of the cured product due to residual ultraviolet radical polymerization initiator. The amount is preferred to be 0.1–5 parts by weight.

One or more coloring materials selected from coloring pigments, coloring dyes and bright pigments may be used with the photocurable composition of the invention. Coloring pigments which may be used include known organic and inorganic pigments described in "Updated Pigment Handbook" (ed. Association of Japan Pigment Technology, 1976), including white pigments such as titanium white and zinc oxide and black pigments such as carbon black and titanium black. Coloring dyes which may be used include known ones described in "Dye Handbook" (ed. The Society of Synthetic Organic Chemistry, 1970). Bright pigments which may be used include aluminum powder, aluminum paste, silver powder, titanium oxide-coated mica, mica-like iron oxide and the like. These coloring materials may be added in an amount of 0–200 parts by weight to 100 parts by weight of the compound with an ethylenically unsaturated bond.

Various different extender pigments may also be added to the photocurable composition of the invention, among which there may be mentioned powders of silica, silica-alumina, alumina, aluminum hydroxide, quartz, calcium carbonate, kaolin, talc, mica, aluminum sulfate and calcium phosphate, as well as powders having the particle surfaces coated with a polyfunctional (meth)acrylic monomer or silane coupling agent. There is no problem with separate addition of 2 or more different types of extender pigments, or their addition after admixture.

The photocurable composition of the invention may be mixed with a binder, such as an organic polymer, and applied onto a glass plate, an aluminum or other metal plate, or a polyethylene terephthalate or other polymer film. As polymers which may be used in admixture with the photocurable composition of the invention there may be mentioned polymers and copolymers of polyacrylates, poly-α-alkylacrylates, polyamides, polyvinylacetals, polyurethanes, polycarbonates, polystyrenes and polyvinyl esters, and specifically there may be mentioned polymethacrylate, polymethyl methacrylate, polyethyl methacrylate, polyvinyl carbazole, polyvinyl pyrrolidone, polyvinyl butyral, polyvinyl acetate, novolac resins, phenol resins, epoxy resins and alkyd resins.

The photocurable composition of the invention may be used as a solventless composition, as a contribution toward improvement of the earth environment. It may, of course, also be used in a form diluted with a conventional solvent. The solvent used in such cases may be any common solvent used for conventional coating, etc., examples of which are aromatic hydrocarbons such as toluene and xylene, alcohols such as ethanol, 2-propanol and 1-butanol, ketones such as acetone, methyl ethyl ketone and methyl isobutyl ketone, ethers such as diethyleneglycol dimethyl ether and triethyleneglycol dimethyl ether, esters such as ethyl acetate, n-butyl acetate and amyl acetate, and monoethers of ethylene glycol such as methyl cellosolve and ethyl cellosolve. These solvents may be used alone or in mixtures of 2 or more. An organic solvent lowers the viscosity of the composition and improves the workability and adhesion to the substrates for the cured product.

A thermal polymerization inhibitor may also be added to the photocurable composition of the invention, for the purpose of preventing polymerization during periods of storage. As concrete examples of thermal polymerization inhibitors to be added to the photocurable composition of the invention there may be mentioned p-methoxyphenol, hydroquinone, alkyl-substituted hydroquinone, catechol, t-butylcatechol and phenothiazine.

The photocurable composition of the invention may also employ, depending on the purpose, an anti-fogging agent, an anti-discoloring agent, a fluorescent brightener, a surfactant, a plasticizer, a flame-retardant, an antioxidant, an ultraviolet absorber, a foaming agent, an anti-fungal agent, an antistatic agent, a magnetic substance, a conductive material, etc.

The photocuring process of the invention is accomplished by curing of the aforementioned photocurable composition of the invention after it has been coated onto the substrate, by simultaneous or separate irradiation of ultraviolet light of wavelength 200–400 nm and visible light of wavelength 400–740 nm. Examples of light sources for emission of the ultraviolet light of 200–400 nm include high pressure mercury lamps, super high pressure mercury lamps, metal halide lamps, short arc metal halide lamps, xenon lamps and excimer lasers.

Examples of light sources for emission of visible light of 400–740 nm include high pressure mercury lamps, super high pressure mercury lamps, metal halide lamps, short arc metal halide lamps, xenon lamps, sodium lamps, halogen lamps, incandescent lamps, sunlight and semiconductor lasers. Complete curing with a single light source is possible if the light source used is one which simultaneously emits a high output of ultraviolet light of 200–400 nm and visible light of 400–740 nm, such as a high pressure mercury lamp, super high pressure mercury lamp, metal halide lamp, short arc metal halide lamp or xenon lamp.

Of the above-mentioned light sources, high pressure mercury lamps, super high pressure mercury lamps, metal halide lamps, short arc metal halide lamps and xenon lamps are ones from which light is emitted by heating a substance with an atomic structure which tends to radiate electromagnetic waves including light to a vapor state in a bulb or emission tube, and then externally applying a large amount of energy by electric discharge or the like. A detailed description may be found in "Ultraviolet Curing Systems" (Kiyomi Kato, Gakkai Publishing Center, 1989), p.375–394 and "Optical Engineering Handbook" (Asakura Shoten, 1986), p.465–469.

On the other hand, incandescent lamps and halogen lamps are light sources of the type from which light is irradiated by heating a heating element in a bulb or emission tube to an incandescent state using an electric current. A tungsten filament is usually used as the heating element. A detailed description may be found in "Optical Engineering Handbook" (Asakura Shoten, 1986), p.462–463.

The photocurable composition and photocuring process according to the present invention may be applied not only to coatings, adhesives and tackifiers, but also to various types of recording media which include microcapsules and photosensitive materials such as inks and electron photographic and holographic materials which are applied onto substrates together with binders.

The present invention will now be explained by way of the following examples. These examples, however, are not intended to restrict the invention.

[Preparation of Coatings]

Coating compositions were prepared containing the coloring pigments with the compositions listed in Table 2. Clear coating paints were also prepared with the compositions listed in Table 3.

[Preparation of Samples and Comparative Samples]

Photocuring samples were prepared by mixing different paints, visible light absorbing cationic dyes, quaternary boron salt sensitizers and ultraviolet radical polymerization initiators, with the mixing compositions listed in Table 4. Comparative samples for Table 4 were also prepared in the same manner with the compositions listed in Table 5.

Photocuring samples were prepared by mixing different paints, visible light absorbing cationic dyes, quaternary boron salt sensitizers, polymerization accelerators and ultraviolet radical polymerization initiators, with the mixing compositions listed in Table 6. The compositions listed in Table 5 were used as comparative samples for Table 6.

TABLE 2

Compositions for coloring paints

| | Type and composition of paint | | | |
|---|---|---|---|---|
| | White paint 1 | White paint 2 | White paint 3 | Metallic paint |
| Type and content of compound with ethylenically unsaturated bond | AT-600*1 46.7 pts/wt 9EG-A*2 14.0 pts/wt isobornyl acrylate 14.0 pts/wt | Aronix M-8030*3 42.0 pts/wt 14EG-A*4 28.0 pts/wt | Ripoxy SP-1509*5 49.0 pts/wt dicyclopentanyl acrylate 21.0 pts/wt | AT-600 60.0 pts/wt PTMGA-250*6 18.0 pts/wt isobornyl acrylate 18.0 pts/wt |
| Type and content of pigment | CR-90*7 30.0 pts/wt | same as left | same as left | 561PS*8 15.4 pts/wt |
| Type and content of solvent | butyl acetate 18.0 pts/wt | same as left | same as left | butyl acetate 30.0 pts/wt |
| Type and content of additives | Homogenol L-18*12 1.0 pt/wt Polyflow No.75*13 1.0 pt/wt | same as left | same as left | Polyflow No.75 1.0 pt/wt |

| | Type and composition of paint | | |
|---|---|---|---|
| | Yellow paint | Red paint | Blue paint |
| Type and content of compound with ethylenically unsaturated bond | AT-600 60.0 pts/wt PTMGA-250 18.0 pts/wt isobornyl acrylate | same as left | same as left |

TABLE 2-continued

Compositions for coloring paints

| | | | |
|---|---|---|---|
| Type and content of pigment | 18.0 pts/wt benzimidazolone yellow pigment*9 10.0 pts/wt | quinacridone red pigment*10 10.0 pts/wt | phthalo-cyanine blue pigment*11 10.0 pts/wt |
| Type and content of solvent | butyl acetate 10.0 pts/wt xylene 10.0 pts/wt | same as left | same as left |
| Type and content of additives | Solsperse*14 24000GR 1.0 pt/wt Polyflow No.75 1.0 pt/wt | same as left | same as left |

*1urethane acrylate, Kyoeisha Chemical Co., Ltd.
*2polyether acrylate, Kyoeisha Chemical Co., Ltd.
*3polyester acrylate, Toagosei Chemical Industry Co., Ltd.
*4polyether acrylate, Kyoeisha Chemical Co., Ltd.
*5epoxy acrylate, Showa Highpolymer Co., Ltd.
*6polyether acrylate, Kyoeisha Chemical Co., Ltd.
*7titanium oxide, Ishihara Sangyo Kaisha Ltd.
*8aluminum paste, Showa Aluminum Powder K.K.
*9Dainichiseika Color & Chemicals Mfg. Co., Ltd.
*10Dainichiseika Color & Chemicals Mfg. Co., Ltd.
*11Dainichiseika Color & Chemicals Mfg. Co., Ltd.
*12dispersing agent, Kao Corporation
*13levelling agent, Kyoeisha Chemical Co., Ltd.
*14dispersing agent, Zeneca

TABLE 3

Compositions for clear coatings

| | Type of clear coating | | | |
|---|---|---|---|---|
| | Clear coating 1 | Clear coating 2 | Clear coating 3 | Clear coating 4 |
| Type and content of compound with ethylenically unsaturated bond | AT-600 66.7 pts/wt PTMGA-250 20.0 pts/wt isobornyl acrylate 20.0 pts/wt | AT-600 66.7 pts/wt 9EG-A 40.0 pts/wt | Ripoxy SP-1529X*1 60.0 pts/wt 9EG-A 20.0 pts/wt dicyclopentanyl acrylate 20.0 pts/wt | Aronix M-8030 70.0 pts/wt 14EG-A 30.0 pts/wt |

*1epoxy acrylate, Showa Highpower Co., Ltd.

TABLE 4

Compositions for photocuring samples

| | Type and content of paint | Type and content of ultraviolet radical polymerization initiator | Visible light-absorbing cationic dye cation | anion | Cationic dye content | Anion portion of quaternary boron salt sensitizer (cation portions all tetra-n-butylammonium) | Quaternary boron salt sensitizer content |
|---|---|---|---|---|---|---|---|
| Sample 1 | white paint 1 100 pts/wt | Irgacure 184*1 2.0 pts/wt | Table 1-5 | chloride anion | 0.02 pt/wt | n-butyltriphenyl borate | 0.20 pt/wt |
| Sample 2 | white paint 2 100 pts/wt | Irgacure 184*1 2.0 pts/wt | Table 1-4 | iodide anion | 0.02 pt/wt | n-butyltri(4-t-butylphenyl) borate | 0.40 pt/wt |
| Sample 3 | white paint 3 100 pts/wt | Darocur 1173*2 2.0 pts/wt | Table 1-1 | tetraphenyl borate | 0.03 pt/wt | n-butyltri(2-tolyl) borate | 0.30 pt/wt |
| Sample 4 | metallic paint 100 pts/wt | Irgacure 651*3 2.0 pts/wt | Table 1-2 | perchlorate anion | 0.03 pt/wt | n-butyltri(4-tolyl) borate | 0.50 pt/wt |
| Sample 5 | yellow paint 100 pts/wt | Irgacure 1700*4 2.5 pts/wt | Table 1-6 | tetraphenyl borate | 0.05 pt/wt | n-butyltriphenyl borate | 0.50 pt/wt |
| Sample 6 | red paint 100 pts/wt | Irgacure 184 2.0 pts/wt | Table 1-8 | tetraphenyl borate | 0.04 pt/wt | n-butyltriphenyl borate | 0.50 pt/wt |
| Sample 7 | blue paint 100 pts/wt | Darocur 1173 2.0 pts/wt Lucirin TPO*5 0.5 pt/wt | Table 1-7 | tetraphenyl borate | 0.05 pt/wt | n-butyltri(4-fluoro-2-methylphenyl) borate | 0.70 pt/wt |

*11-hydroxycyclohexyl phenyl ketone, Ciba-Geigy
*22-hydroxy-2-methyl-1-phenylpropan-1-one, Ciba-Geigy
*3benzyldimethyl ketal, Ciba-Geigy
*4mixture of 2-hydroxy-2-methyl-1-phenylpropan-1-one:bis(2,6-dimethoxybenzoyl)-2,4,4-trimethylpentylphosphine oxide = 3:1, Ciba-Geigy
*52,4,6-trimethylbenzoyldiphenylphosphine oxide, BASF
The above samples were prepared by dissolving the visible light-absorbing cationic dye, quaternary boron salt sensitizer and ultraviolet radical polymerization initiator in 5 parts by weight of N-methylpyrrolidone, and then adding the paint.

TABLE 5

Composition for comparative photocuring samples

| | Type and content of paint | Type and content of ultraviolet radical polymerization initiator | Remarks |
|---|---|---|---|
| Comparative sample 1 | white paint 1 100 pts/wt | Irgacure 184 2.0 pts/wt | comparison for samples 1, 8, 9 |
| Comparative sample 2 | white paint 2 100 pts/wt | ditto | comparison for samples 2, 10, 11 |
| Comparative sample 3 | white paint 3 100 pts/wt | Darocur 1173 2.0 pts/wt | comparison for samples 3, 12, 13 |
| Comparative sample 4 | metallic paint 100 pts/wt | Irgacure 651 2.0 pts/wt | comparison for samples 4, 14, 15 |
| Comparative sample 5 | yellow paint 100 pts/wt | Irgacure 1700 2.5 pts/wt | comparison for samples 5, 16, 17 |
| Comparative sample 6 | red paint 100 pts/wt | Irgacure 184 2.0 pts/wt | comparison for samples 6, 18, 19 |
| Comparative sample 7 | blue paint 100 pts/wt | Darocur 1173 2.0 pts/wt Lucirin TPO 0.5 pt/wt | comparison for samples 7, 20, 21 |

TABLE 6

Compositions for photocuring samples (paints, ultraviolet radical polymerization initiators and visible light-absorbing cationic dyes)

| | Type and content of paint | Type/content of ultraviolet radical polymerization initiator | Visible light-absorbing cationic dye cation | anion | Cationic dye content |
|---|---|---|---|---|---|
| Sample 8 | white paint 1 100 pts/wt | Irgacure 184*¹ 2.0 pts/wt | Table 1-5 | chloride anion | 0.020 pt/wt |
| Sample 9 | white paint 1 100 pts/wt | Irgacure 184*¹ 2.0 pts/wt | Table 1-5 | chloride anion | 0.020 pt/wt |
| Sample 10 | white paint 2 100 pts/wt | Irgacure 184*¹ 2.0 pts/wt | Table 1-4 | iodide anion | 0.020 pt/wt |
| Sample 11 | white paint 2 100 pts/wt | Irgacure 184*¹ 2.0 pts/wt | Table 1-4 | iodide anion | 0.020 pt/wt |
| Sample 12 | white paint 3 100 pts/wt | Darocur 1173*² 2.0 pts/wt | Table 1-1 | tetra-phenyl borate | 0.030 pt/wt |
| Sample 13 | white paint 3 100 pts/wt | Darocur 1173*² 2.0 pts/wt | Table 1-1 | tetra-phenyl borate | 0.030 pt/wt |
| Sample 14 | metallic paint 100 pts/wt | Irgacure 651*³ 2.0 pts/wt | Table 1-2 | per-chlorate anion | 0.030 pt/wt |
| Sample 15 | metallic paint 100 pts/wt | Irgacure 651*³ 2.0 pts/wt | Table 1-2 | chlorate anion | 0.030 pt/wt |
| Sample 16 | yellow paint 100 pts/wt | Irgacure 1700*⁴ 2.5 pts/wt | Table 1-6 | tetra-phenyl borate | 0.050 pt/wt |
| Sample 17 | yellow paint 100 pts/wt | Irgacure 1700*⁴ 2.5 pts/wt | Table 1-6 | tetra-phenyl borate | 0.050 pt/wt |
| Sample 18 | red paint 100 pts/wt | Irgacure 184 2.0 pts/wt | Table 1-8 | tetra-phenyl borate | 0.040 pt/wt |
| Sample 19 | red paint 100 pts/wt | Irgacure 184 2.0 pts/wt | Table 1-8 | tetra-phenyl borate | 0.040 pt/wt |
| Sample 20 | blue paint 100 pts/wt | Darocur 1173 2.0 pts/wt Lucirin TPO*⁵ 0.5 pt/wt | Table 1-7 | tetra-phenyl borate | 0.050 pt/wt |
| Sample 21 | blue paint 100 pts/wt | Lucirin TPO*⁵ 0.5 pt/wt | Table 1-7 | tetra-phenyl borate | 0.050 pt/wt |

Compositions for photocuring samples (quaternary boron salt sensitizers, polymerization accelerators)

| | Quaternary boron salt sensitizer anion (cation portions are all tetra-n-butylammonium) | Quaternary boron salt sensitizer content | Polymerization accelerator | Polymerization accelerator content |
|---|---|---|---|---|
| Sample 8 | n-butyltriphenyl borate | 0.20 pt/wt | triphenylsulfonium triflate | 0.30 pt/wt |
| Sample 9 | n-butyltriphenyl borate | 0.20 pt/wt | diphenyliodonium hexafluorophosphate | 0.30 pt/wt |
| Sample 10 | n-butyltri(4-t-butylphenyl) borate | 0.40 pt/wt | N-ethoxy-4-phenyl pyridinium hexafluorophosphate | 0.30 pt/wt |
| Sample 11 | n-butyltri(4-t-butylphenyl) borate | 0.40 pt/wt | trichloromethyl-phenylsulfone | 0.30 pt/wt |
| Sample 12 | n-butyltri(2-tolyl) borate | 0.30 pt/wt | t-butylperoxy-benzoate | 0.40 pt/wt |
| Sample 13 | n-butyltri(2-(tolyl) borate | 0.30 pt/wt | 2,4,6-tris(trichloromethyl)-s-triazine | 0.30 pt/wt |
| Sample 14 | n-butyltri(4-tolyl) borate | 0.50 pt/wt | diphenyl(4-fluoro phenyl)sulfonium triflate | 0.40 pt/wt |
| Sample 15 | n-butyltri(4-tolyl) borate | 0.50 pt/wt | bis(4-t-butyl-phenyl)iodonium hexafluoroantimonate | 0.50 pt/wt |
| Sample 16 | n-butyltriphenyl borate | 0.50 pt/wt | N,N'-diethoxy-4,4'-bipyridinium bis-(hexafluorophosphate) | 0.50 pt/wt |
| Sample 17 | n-butyltriphenyl borate | 0.50 pt/wt | tribromomethyl-phenylsulfone | 0.50 pt/wt |
| Sample 18 | n-butyltriphenyl borate | 0.50 pt/wt | 3,3',4,4'-tetra(t-butylperoxy-carbonyl)-benzophenone | 0.30 pt/wt |
| Sample 19 | n-butyltriphenyl borate | 0.50 pt/wt | 2-(4-methoxy-styryl)-4,6-bis(trichloromethyl)-s-triazine | 0.30 pt/wt |
| Sample 20 | n-butyltri(4-fluoro-2-methyl phenyl) borate | 0.70 pt/wt | diphenylbenzyl-sulfonium hexafluoroantimonate | 0.50 pt/wt |
| Sample 21 | n-butyltri(4-fluoro-2-methyl phenyl) borate | 0.70 pt/wt | N-ethoxy-pyridinium hexafluorophosphate | 0.50 pt/wt |

The above samples were prepared by dissolving the visible light absorbing cationic dye, quaternary boron salt sensitizer, polymerization accelerator and ultraviolet radical polymerization initiator in 5 parts by weight of N-methylpyrrolidone, and then adding the paint.

[Curing Process for Each Sample]

Curing conditions A: Curing with metal halide lamp

Samples 1–21 and comparative samples 1–7 were coated onto aluminum plates (150×70 mm) with a #50 bar coater to a film thickness of about 50 μm. The coatings of samples 1–21 and comparative samples 1–7 were then subjected to photocuring in air with a metal halide lamp (UVL-6000M2-N1, input power 120 W/cm, Ushio Inc.) which emits light of 200–740 nm. The metal halide lamp was incorporated in a belt conveyor-type light-irradiating apparatus (UVC-5033, product of Ushio Inc.), the distance between the metal halide lamp and the coatings was 25 cm, the belt conveyor speed was 1.7 m/min, and the irradiation was performed twice.

Curing conditions B: Curing with halogen lamp and high pressure mercury lamp

Samples 1–21 and comparative samples 1–7 were coated in the same manner to a film thickness of about 50 μm, after which they were irradiated with light in air for 20 seconds at an irradiation distance of 30 cm, using a 1.5 kW halogen lamp (RDS Corporation HG-100V-1.5 KWB) which emits light of 400 nm and greater. Photocuring was then performed in air with a high pressure mercury lamp (UVL-6000-O/N, input power 80 W/cm, Ushio Inc.) which emits light of 200–740 nm. The high pressure mercury lamp was incorporated in a belt conveyor-type light-irradiating apparatus as in curing conditions A, the distance between the high pressure mercury lamp and the coatings was 25 cm, the belt conveyor speed was 2 m/min, and the irradiation was performed twice.

Curing conditions C: Curing with short arc metal halide lamp and high pressure mercury lamp Samples 1–7 and comparative samples 1–7 were coated in the same manner to a film thickness of about 50 μm, after which they were irradiated with light in air for 20 seconds at an irradiation distance of 1 m, using a 2.0 kW short arc metal halide lamp (Dynabeam 2, Toshiba Lighting & Technology Corporation) which emits light of 300 nm and greater. Photocuring was then performed in air with a high pressure mercury lamp (UVL-6000-O/N, input power 80 W/cm, Ushio Inc.) which emits light of 200–740 nm. The distance between the high pressure mercury lamp and the coatings was 25 cm, the belt conveyor speed was 2 m/min, and the irradiation was performed twice.

Curing conditions D: Curing with xenon lamp and high pressure mercury lamp

Samples 1–7 and comparative samples 1–7 were coated in the same manner to a film thickness of about 50 μm, after which they were irradiated with light in air for 20 seconds at an irradiation distance of 50 cm, using a 1.0 kW xenon lamp (SUPERSOL-S 1003SR, Ushio U-tech Inc.) which emits light of 300 nm and greater. Photocuring was then performed in air with a high pressure mercury lamp (UVL-6000-O/N, input power 80 W/cm, Ushio Inc.) which emits light of 200–740 nm. The distance between the high pressure mercury lamp and the coatings was 25 cm, the belt conveyor speed was 2 m/min, and the irradiation was performed twice.

[Evaluation of Coatings]

Cured state

Designating samples 1–21 cured under curing conditions A as Examples 1–21 and comparative samples 1–7 as Comparative Examples 1–7, the cured states of the front and back surfaces of the coatings were evaluated using the evaluation method of "JIS K-5400 (universal paint testing method), 6.5 hour drying time".

Also, about 0.5 g of the cured coating was peeled off the plate, and the coating was refluxed for one hour in about 100 ml of acetone to extract the acetone-soluble portion, after which the acetone-insoluble coating was dried and the acetone-insoluble resin content ratios before and after acetone reflux were measured. The acetone-insoluble resin content ratio is calculated with the following equation, with a larger value indicating greater polymerization/three-dimensional crosslinking of the coating, and thus better curability.

acetone-insoluble resin content ratio (%)=(acetone-insoluble resin portion of coating/total resin portion of coating)×100

The results are shown in Table 7. Likewise, samples 1–21 and comparative samples 1–7 cured under curing conditions B were evaluated as Examples 22–42 and Comparative Examples 8–14, respectively; samples 1–7 and comparative samples 1–7 cured under curing conditions C were evaluated as Examples 43–49 and Comparative Examples 15–21, respectively; and samples 1–7 and comparative samples 1–7 cured under curing conditions D were evaluated as Examples 50–56 and Comparative Examples 22–28, respectively. The results are shown in Tables 8, 9 and 10.

TABLE 7

State of cured coatings photocured under curing conditions A

| | | State of cured coating*1 | | Acetone-insoluble resin content ratio |
|---|---|---|---|---|
| | Sample | Front | Back | (%) |
| Example 1 | sample 1 | A | A | 84 |
| Example 2 | sample 2 | A | A | 93 |
| Example 3 | sample 3 | A | A | 82 |
| Example 4 | sample 4 | A | A | 81 |
| Example 5 | sample 5 | A | A | 86 |
| Example 6 | sample 6 | A | A | 84 |
| Example 7 | sample 7 | A | A | 87 |
| Example 8 | sample 8 | A | A | 91 |
| Example 9 | sample 9 | A | A | 90 |
| Example 10 | sample 10 | A | A | 94 |
| Example 11 | sample 11 | A | A | 95 |
| Example 12 | sample 12 | A | A | 94 |
| Example 13 | sample 13 | A | A | 89 |
| Example 14 | sample 14 | A | A | 89 |
| Example 15 | sample 15 | A | A | 89 |
| Example 16 | sample 16 | A | A | 94 |
| Example 17 | sample 17 | A | A | 92 |
| Example 18 | sample 18 | A | A | 91 |
| Example 19 | sample 19 | A | A | 89 |
| Example 20 | sample 20 | A | A | 94 |
| Example 21 | sample 21 | A | A | 92 |
| Comp. Example 1 | comp. sample 1 | A | D | 57 |
| Comp. Example 2 | comp. sample 2 | A | C | 62 |
| Comp. Example 3 | comp. sample 3 | A | D | 54 |
| Comp. Example 4 | comp. sample 4 | A | C | 65 |
| Comp. Example 5 | comp. sample 5 | A | C | 62 |
| Comp. Example 6 | comp. sample 6 | A | C | 62 |
| Comp. Example 7 | comp. sample 7 | A | C | 60 |

*1The extent of curing was evaluated with the following 4 grades:
A: No finger imprint on coating surface or feeling of coating movement when center of coating film was firmly pressed between thumb and forefinger, and no abrasive damage to coating surface upon repeated rapid rubbing of center of coating film with fingertip.
B: No rubbing scars on coating surface when center of coating film was gently rubbed with fingertip.
C: No residue on fingertip when center of coating film was lightly touched with fingertip.
D: Paint adhered to fingertip when center of coating film was lightly touched with fingertip.

TABLE 8

State of cured coatings photocured under curing conditions B

| | | State of cured coating*1 | | Acetone-insoluble resin content ratio |
|---|---|---|---|---|
| | Sample | Front | Back | (%) |
| Example 22 | sample 1 | A | A | 80 |
| Example 23 | sample 2 | A | A | 89 |
| Example 24 | sample 3 | A | A | 79 |
| Example 25 | sample 4 | A | A | 78 |
| Example 26 | sample 5 | A | A | 80 |
| Example 27 | sample 6 | A | A | 81 |
| Example 28 | sample 7 | A | A | 83 |
| Example 29 | sample 8 | A | A | 86 |
| Example 30 | sample 9 | A | A | 90 |
| Example 31 | sample 10 | A | A | 92 |
| Example 32 | sample 11 | A | A | 93 |

TABLE 8-continued

State of cured coatings photocured under curing conditions B

| | Sample | State of cured coating*[1] Front | State of cured coating*[1] Back | Acetone-insoluble resin content ratio (%) |
|---|---|---|---|---|
| Example 33 | sample 12 | A | A | 89 |
| Example 34 | sample 13 | A | A | 91 |
| Example 35 | sample 14 | A | A | 87 |
| Example 36 | sample 15 | A | A | 90 |
| Example 37 | sample 16 | A | A | 89 |
| Example 38 | sample 17 | A | A | 89 |
| Example 39 | sample 18 | A | A | 87 |
| Example 40 | sample 19 | A | A | 90 |
| Example 41 | sample 20 | A | A | 92 |
| Example 42 | sample 21 | A | A | 92 |
| Comp. Example 8 | comp. sample 1 | A | D | 52 |
| Comp. Example 9 | comp. sample 2 | A | C | 59 |
| Comp. Example 10 | comp. sample 3 | A | D | 50 |
| Comp. Example 11 | comp. sample 4 | A | D | 52 |
| Comp. Example 12 | comp. sample 5 | A | D | 52 |
| Comp. Example 13 | comp. sample 6 | A | D | 54 |
| Comp. Example 14 | comp. sample 7 | A | D | 52 |

TABLE 9

State of cured coatings photocured under curing conditions C

| | Sample | State of cured coating Front | State of cured coating Back | Acetone-insoluble resin content ratio (%) |
|---|---|---|---|---|
| Example 43 | sample 1 | A | A | 82 |
| Example 44 | sample 2 | A | A | 91 |
| Example 45 | sample 3 | A | A | 76 |
| Example 46 | sample 4 | A | A | 77 |
| Example 47 | sample 5 | A | A | 82 |
| Example 48 | sample 6 | A | A | 81 |
| Example 49 | sample 7 | A | A | 84 |
| Comp. Example 15 | comp. sample 1 | A | D | 54 |
| Comp. Example 16 | comp. sample 2 | A | C | 60 |
| Comp. Example 17 | comp. sample 3 | A | D | 52 |
| Comp. Example 18 | comp. sample 4 | A | D | 54 |
| Comp. Example 19 | comp. sample 5 | A | D | 51 |
| Comp. Example 20 | comp. sample 6 | A | C | 56 |
| Comp. Example 21 | comp. sample 7 | A | D | 53 |

TABLE 10

State of cured coatings photocured under curing conditions D

| | Sample | State of cured coating Front | State of cured coating Back | Acetone-insoluble resin content ratio (%) |
|---|---|---|---|---|
| Example 50 | sample 1 | A | A | 82 |
| Example 51 | sample 2 | A | A | 90 |
| Example 52 | sample 3 | A | A | 81 |
| Example 53 | sample 4 | A | A | 83 |
| Example 54 | sample 5 | A | A | 80 |
| Example 55 | sample 6 | A | A | 84 |
| Example 56 | sample 7 | A | A | 82 |
| Comp. Example 22 | comp. sample 1 | A | D | 52 |
| Comp. Example 23 | comp. sample 2 | A | C | 60 |
| Comp. Example 24 | comp. sample 3 | A | D | 51 |
| Comp. Example 25 | comp. sample 4 | A | D | 53 |
| Comp. Example 26 | comp. sample 5 | A | D | 51 |
| Comp. Example 27 | comp. sample 6 | A | C | 56 |
| Comp. Example 28 | comp. sample 7 | A | D | 52 |

State of coloration

Samples with the compositions listed in Table 11 were prepared. Here, the visible light-absorbing cationic dyes listed in Table 1 were used for samples 22–26, and the near infrared light-absorbing cationic dyes listed in Table 12 were used for comparative samples 8–12. Sample 22 and comparative sample 8, sample 23 and comparative sample 9, sample 24 and comparative sample 10, sample 25 and comparative sample 11 and sample 26 and comparative sample 12 were identical in all components except for the cationic dye, and were prepared with the purpose of comparing the colorability of the coatings with different cationic dyes. These were cured under curing conditions B, and the color phases of the coatings were compared visually. These were also compared against a standard color chart according to "JIS Z 8721 (identification method by color-order system), and the color phases of the coatings were evaluated by selecting the chart color (expressed as HV/C) nearest to the color phase of the coating. The results are shown in Table 13.

TABLE 11

Compositions for photocuring samples used for discoloration test of cured coatings

| | Type and content of paint | Type and content of ultraviolet radical polymerization initiator | Type of cationic dye cation | Type of cationic dye anion | Cationic dye content | Anion portion of quaternary boron salt sensitizer (cation portions all tetra-n-butylammonium) | Quaternary boron-based sensitizer content | Remarks |
|---|---|---|---|---|---|---|---|---|
| Sample 22 | clear paint 1 100 pts/wt | Irgacure 184 2.0 pts/wt | Table 1-2 | perchlorate anion | 0.04 pt/wt | n-butyltriphenyl borate | 0.50 pt/wt | |
| Sample 23 | clear paint 1 100 pts/wt | Darocur 1173 2.0 pts/wt | Table 1-4 | iodide anion | 0.05 pt/wt | n-butyltri(4-t-butylphenyl) borate | 0.50 pt/wt | |
| Sample 24 | clear paint 2 100 pts/wt | Darocur 1173 2.0 pts/wt | Table 1-5 | chloride anion | 0.05 pt/wt | n-butyltriphenyl borate | 0.50 pt/wt | |
| Sample 25 | clear paint 3 100 pts/wt | Darocur 1173 2.0 pts/wt | Table 1-6 | chloride anion | 0.05 pt/wt | n-butyltri(4-tolyl) borate | 0.50 pt/wt | |

TABLE 11-continued

Compositions for photocuring samples used for discoloration test of cured coatings

| | Type and content of paint | Type and content of ultraviolet radical polymerization initiator | Type of cationic dye cation | Type of cationic dye anion | Cationic dye content | Anion portion of quaternary boron salt sensitizer (cation portions all tetra-n-butylammonium) | Quaternary boron-based sensitizer content | Remarks |
|---|---|---|---|---|---|---|---|---|
| Sample 26 | clear paint 4 100 pts/wt | Darocur 1173 2.0 pts/wt | Table 1-7 | tetraphenyl borate | 0.09 pt/wt | n-butyltri(2-tolyl) borate | 0.50 pt/wt | |
| Comp. sample 8 | clear paint 1 100 pts/wt | Irgacure 184 2.0 pts/wt | Table 12-1 | tetraphenyl borate | 0.082 pt/wt | n-butyltriphenyl borate | 0.50 pt/wt | comparison for sample 22 |
| Comp. sample 9 | clear paint 1 100 pts/wt | Darocur 1173 2.0 pts/wt | Table 12-2 | n-butyltri-phenyl borate | 0.111 pt/wt | n-butyltri(4-t-butylphenyl) borate | 0.50 pt/wt | comparison for sample 23 |
| Comp. sample 10 | clear paint 2 100 pts/wt | Darocur 1173 2.0 pts/wt | Table 12-3 | tetraphenyl borate | 0.100 pt/wt | n-butyltriphenyl borate | 0.50 pt/wt | comparison for sample 24 |
| Comp. sample 11 | clear paint 3 100 pts/wt | Darocur 1173 2.0 pts/wt | Table 12-2 | p-toluene-sulfonate anion | 0.082 pt/wt | n-butyltri(4-tolyl) borate | 0.50 pt/wt | comparison for sample 25 |
| Comp. sample 12 | clear paint 4 100 pts/wt | Darocur 1173 2.0 pts/wt | Table 12-2 | p-toluene-sulfonate anion | 0.093 pt/wt | n-butyltri(2-tolyl) borate | 0.50 pt/wt | comparison for sample 26 |

TABLE 12

| No. | Chemical structure | Maximum absorption wavelength (type of solvent) |
|---|---|---|
| 1 | | 820 nm (trimethylolpropane triacrylate) |
| 2 | | 820 nm (trimethylolpropane triacrylate) |
| 3 | | 830 nm (trimethylolpropane triacrylate) |

TABLE 13

Coloration state of coatings

| | Cationic dye used | | | |
|---|---|---|---|---|
| Sample used | Visible light-absorbing cationic dye | Near infrared light-absorbing cationic dye | Visually determined state of coating coloration | Color phase of coating (HV/C) |
| Ex. 57 sample 22 | table 1-2 | — | colorless | N8.8 |
| Comp Ex. 29 comp. sample 8 | — | table 12-1 | yellow | 5Y9/2 |
| Ex. 58 sample 23 | table 1-4 | — | colorless | N8.9 |
| Comp. Ex. 30 comp. sample 9 | — | table 12-2 | yellow-green | 5GY9/1 |
| Ex. 59 sample 24 | table 1-5 | — | colorless | N8.8 |
| Comp. Ex. 31 comp. sample 10 | — | table 12-3 | yellow | 5Y9/2 |
| Ex. 60 sample 25 | table 1-6 | — | colorless | N9.0 |
| Comp. Ex. 32 comp. sample 11 | — | table 12-2 | yellow-green | 5GY9/1 |
| Ex. 61 sample 26 | table 1-7 | — | colorless | N8.6 |
| Comp. Ex. 33 comp. sample 12 | — | table 12-2 | yellow-green | 5GY9/1 |

A photocurable composition according to the present invention comprising a compound with an ethylenically unsaturated group and a cationic dye of general formula (1), a quaternary boron salt sensitizer of general formula (2) and an ultraviolet radical polymerization initiator and optionally a polymerization accelerator of any of general formulas (3) to (8) can be adequately cured in air on the surface and to the interior of the cured product by irradiation of ultraviolet light of wavelength 200–400 nm and visible light of wavelength 400–740 nm, even if it contains a pigment or coloring dye with a strong hiding power. Moreover, the resulting cured product also undergoes no coloration by oxidation products of the cationic dye, thus providing a cured product with an excellent appearance. Consequently, this curable composition and process for photocuring it provide a material and curing process which can be satisfactorily applied in the fields of painting, adhesives, tackifiers, inks and holographic materials.

What is claimed is:

1. A photocurable composition comprising
   (A) 100 parts by weight of a compound with an ethylenically unsaturated bond,
   (B) 0.001–5 parts by weight of a cationic dye with absorptions in the visible light region of 400–740 nm, represented by general formula (1):

$$D^+ \cdot A_1^- \quad (1)$$

wherein $D^+$ is a cationic dye with absorptions in the visible light region of 400–740 nm and $A_1^-$ is an anion,
   (C) 0.005–10 parts by weight of a quaternary boron salt sensitizer represented by general formula (2):

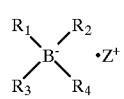

(2)

wherein $R_1$, $R_2$, $R_3$ and $R_4$ each independently represent an alkyl group which may have a substituent, an aryl group which may have a substituent, an allyl group which may have a substituent, an aralkyl group which may have a substituent, an alkenyl group which may have a substituent, an alkynyl group which may have a substituent, a silyl group which may have a substituent, a heterocyclic group or a halogen atom, and $Z^+$ represents a quaternary ammonium cation, quaternary pyridinium cation, quaternary quinolinium cation, phosphonium cation, sulfonium cation, oxosulfonium cation, iodonium cation or metal cation, and (D) 0.01–10 parts by weight of an ultraviolet radical polymerization initiator which generates radicals upon absorption of light of wavelength 200–400 nm, wherein the ultraviolet radical polymerization initiator is a compound represented by general formula (9):

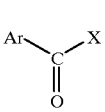

(9)

wherein Ar represents an aryl group which may have a substituent, and X represents a phosphinoyl group with a substituent.

2. A photocurable composition according to claim 1, wherein the cationic dye with absorptions from 400–740 nm is a polymethine-, xanthene-, acridine-, azine-, oxazine-, thiazine-, diarylmethane- or triarylmethane initiator represented by general formula (9) is selected from benzophenone compounds.

3. A photocurable composition according to claim 1, wherein the ultraviolet radical polymerization initiator represented by general formula (9) is selected from acylphosphine oxide compounds.

4. A photocurable composition according to claim 1, which further comprises 0.005–10 parts by weight of at least one polymerization accelerator selected from compounds represented by general formulas (3)–(8):

(3)

wherein $R_5$ and $R_6$ each represent an aryl group which may have a substituent, $R_7$ represents an alkyl group which may have a substituent, an alkenyl group which may have a substituent, an alkynyl group which may have a substituent, an alicyclic group which may have a substituent, an aryl group which may have a substituent or an aralkyl group which may have a substituent, and $A_2^-$ represents an anion:

$$R_8 - I^+ - R_9 \cdot A_3^- \quad (4)$$

Wherein $R_8$ and $R_9$ each represent an aryl group which may have a substituent, and $A_3^-$ represents an anion:

(5)

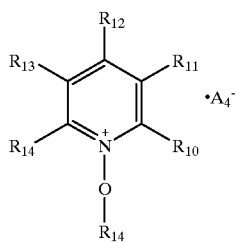

wherein $R_{10}$, $R_{11}$, $R_{12}$, $R_{13}$ and $R_{14}$ each represent a hydrogen atom, halogen atom, cyano group, an alkyl group which may have a substituent, an alkoxy group which may have a substituent, an aryl group which may have a substituent or a heterocyclic group represented by general formula (5), $R_{15}$ represents an alkyl group which may have a substituent, and $A_4^-$ represents an anion:

(6)

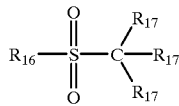

wherein $R_{16}$ represents an aryl group which may have a substituent, and each $R_{17}$ represents a halogen atom:

(7)

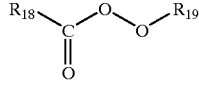

wherein $R_{18}$ represents an aryl group which may have a substituent, and $R_{19}$ represents an alkyl group which may have a substituent, an aryl group which may have a substituent or a benzoyl group which may have a substituent:

(8)

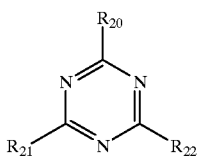

wherein $R_{20}$, $R_{21}$ and $R_{22}$ each represent a trihalomethyl group, an alkyl group which may have a substituent, an alkenyl group which may have a substituent or an aryl group which may have a substituent, provided that at least one thereof is a trihalomethyl group.

5. A photocurable composition according to claim 4, wherein the cationic dye with absorptions from 400–740 nm is a polymethine-, xanthene-, acridine-, azine-, oxazine-, thiazine-, diarylmethane- or triarylmethane cationic dye.

6. A photocurable composition according to claim 4, wherein the ultraviolet radical polymerization initiator represented by general formula (9) is selected from acylphosphine oxide compounds.

7. A process for curing a photocurable composition, which comprises coating a photocurable composition according to any one of claims 1, 2, 3, 4, 5 or 6 on a substrate, and then simultaneously or separately irradiating it with light of wavelength 200–400 nm and light of wavelength 400–740 nm.

8. The process as set forth in claim 7, wherein the light of wavelength 200–400 nm and the light of wavelength 400–740 nm are irradiated by one light source.

9. The process as set forth in claim 7, wherein the coating of the photocurable composition has a thickness of not less than 50 µm.

10. The process as set forth in claim 7, wherein the light irradiation is carried out without providing an oxygen shielding layer on the photocurable composition coating.

* * * * *